United States Patent [19]

Suematsu et al.

[11] 4,275,354
[45] Jun. 23, 1981

[54] PULSE WIDTH MODULATING CIRCUIT

[75] Inventors: Masayuki Suematsu; Takao Mogi, both of Tokyo; Akira Taki, Atsugi, all of Japan

[73] Assignee: Sony Corporation, Tokyo, Japan

[21] Appl. No.: 5,021

[22] Filed: Jan. 19, 1979

[30] Foreign Application Priority Data

Jan. 25, 1978 [JP] Japan .................................. 53-6832

[51] Int. Cl.³ ............................................. H03K 7/08
[52] U.S. Cl. ...................................... 328/58; 328/61; 328/112; 328/129
[58] Field of Search ................. 328/112, 129, 58, 133, 328/61; 307/265

[56] References Cited
U.S. PATENT DOCUMENTS

| | | | |
|---|---|---|---|
| 3,697,879 | 10/1972 | Holliday | 328/61 |
| 3,958,182 | 5/1976 | Sauthier | 328/58 |
| 4,109,210 | 8/1978 | Gerlach et al. | 328/61 |
| 4,166,246 | 8/1979 | Matt | 328/129 X |

*Primary Examiner*—John S. Heyman
*Attorney, Agent, or Firm*—Lewis H. Eslinger; Alvin Sinderbrand

[57] ABSTRACT

First and second counters in a pulse width modulating circuit, whose respective outputs determine the trailing and leading edges of a pulse width modulated signal, count input clock pulses at a constant speed. The number of the pulses applied to the second counter during a cycle relative to the number of the pulses applied to the first counter is increased or decreased by one in response to a modulating pulse to change the counting phase of the second counter thereby changing the width of the pulse width modulated signal. Gates freeze the phases of the two counters at minimum and maximum pulse widths of the pulse width modulated signal to avoid abrupt jumps from minimum to maximum or vice versa.

9 Claims, 49 Drawing Figures

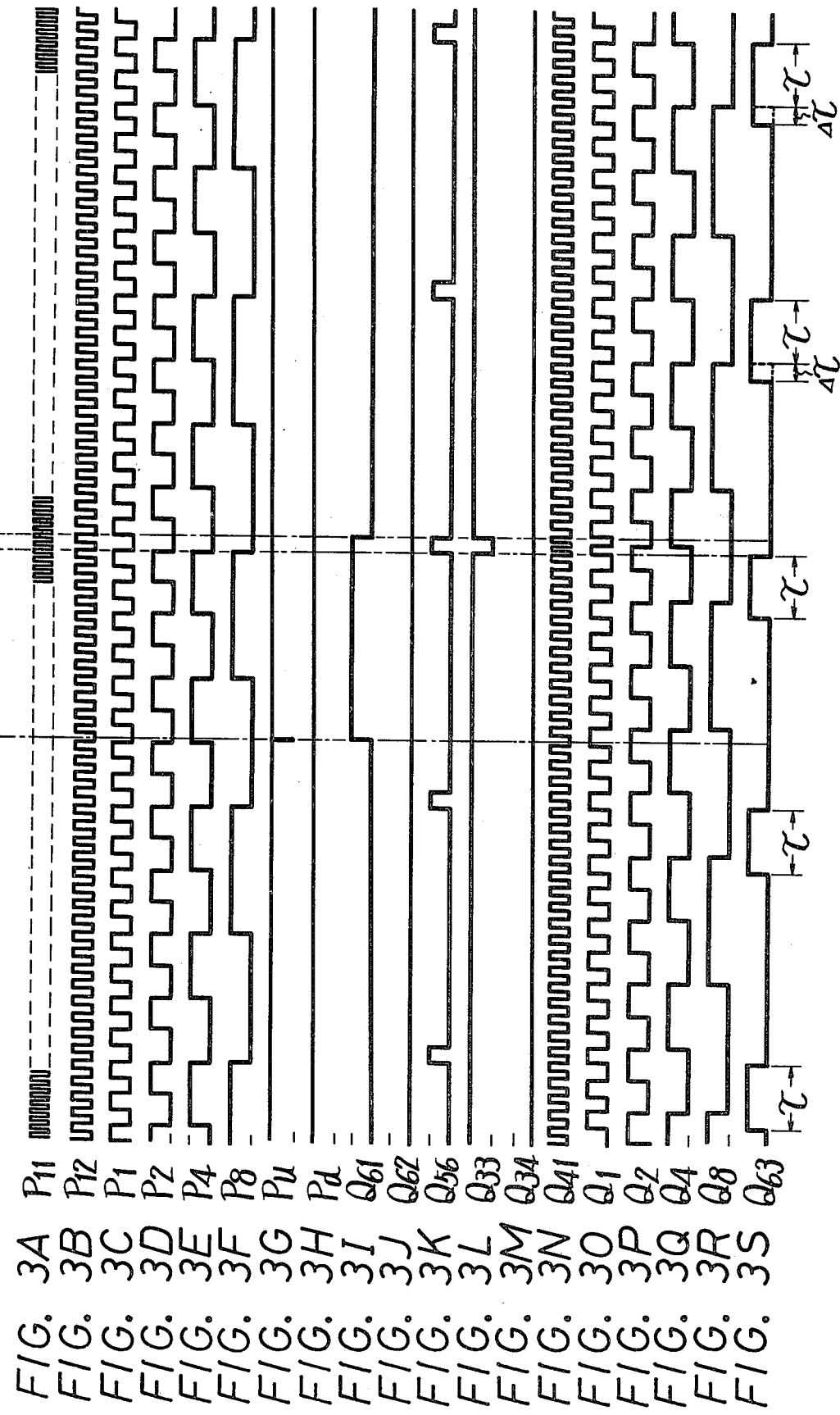

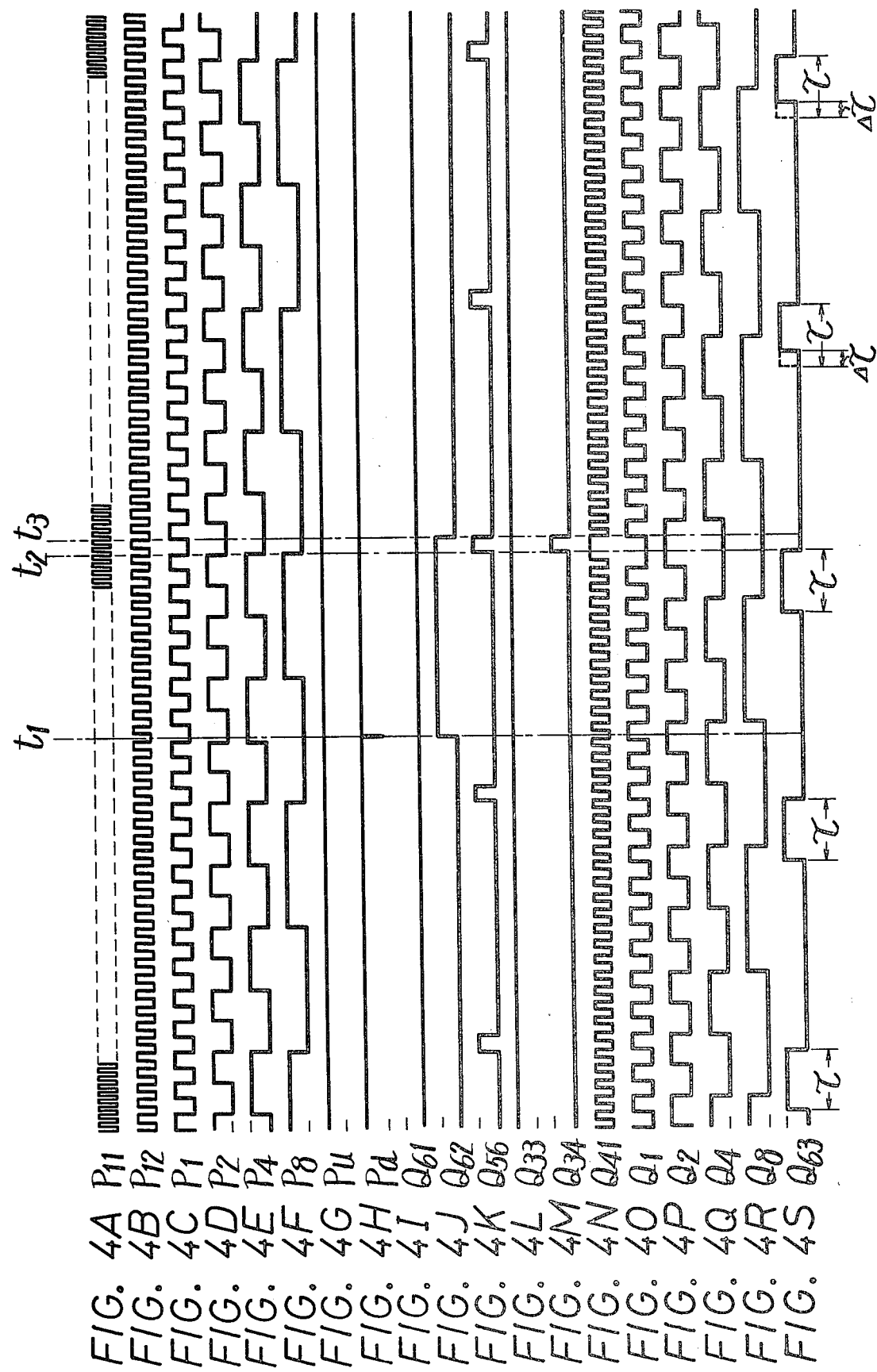

PULSE WIDTH MODULATING CIRCUIT

BACKGROUND OF THE INVENTION

1. Field of the Invention

The present invention relates generally to a pulse width modulating circuit, and is directed more particularly to a pulse width modulating circuit suitable for use in remote control applications such as, for example, the sound volume of a television receiver.

2. Description of the Prior Art

In the prior art when, for example, the sound volume of a television receiver is remotely controlled, each time a viewer of the television receiver remotely controls the sound volume, a transmitter of a remote control device transmits an ultrasonic or a supersonic pulse $P_a$ as shown in FIG. 1A. The supersonic pulse $P_a$ is received by the television receiver which then produces a modulating pulse $P_b$ shown in FIG. 1B each time it receives a supersonic pulse $P_a$. The modulating pulse $P_b$ is fed to a pulse width modulating (PWM) circuit which then produces a pulse width modulated (PWM) pulse $P_c$ whose pulse width is changed for example, is increased at each arrival of the supersonic pulse $P_a$ as shown in FIG. 1C. The pulse width modulated pulse $P_c$ is then integrated to provide a DC voltage $E_d$ whose level increases at every supersonic pulse $P_a$ as shown in FIG. 1D. This DC voltage $E_d$ may be used to control the gain of an audio amplifier.

Thus, the sound volume of the television receiver can be increased each time a supersonic pulse $P_a$ is generated. The sound volume can be similarly decreased using another supersonic pulse not shown.

In order to achieve such pulse width modulation control the prior art combines an up-counter, up-down counter, exclusive OR circuit and other circuits. This combination is, however, expensive.

OBJECTS AND SUMMARY OF THE INVENTION

Accordingly, an object of the present invention is to provide a novel pulse width modulating circuit.

Another object of the invention is to provide a pulse width modulating circuit suitable for use with a television receiver for remotely controlling its sound volume.

A further object of the invention is to provide a pulse width modulating circuit which is simple in construction and inexpensive.

A further object of the invention is to provide a pulse width modulating circuit which prevents abrupt changes between maximum and minimum in the width of the PWM pulses.

According to an aspect of the present invention there is provided a pulse width modulating circuit which comprises pulse generating means for generating clock pulses having a predetermined period, first counter means having an output phase for counting the clock pulses from the pulse generating means, second counter means having an output phase for counting the clock pulses from the pulse generating means, pulse number control means for controlling the number of clock pulses supplied to the second counter means in response to a control signal, and phase detecting means for producing a pulse width modulated signal in response to a phase difference between the output phase of the first counter means and the output phase of the second counter means.

The other objects, features and advantage of the present invention will become apparent from the following description taken in conjunction with accompanying drawings.

BRIEF DESCRIPTION OF THE DRAWINGS

FIGS. 1A, 1B, 1C and 1D are waveform diagrams to which reference will be made in describing pulse width modulating circuits of the prior art;

FIGS. 3A to 3S are waveform diagrams to which reference will be made in explaining the manner in which the width of a PWM pulse is increased according to the embodiment of the invention shown in FIG. 2;

FIGS. 4A to 4S are waveform diagrams to which reference will be made in explaining the manner in which the width of a PWM pulse is decreased according to the embodiment of the invention shown in FIG. 2; and FIGS. 5A to 5F are waveform diagrams to which reference will be made in explaining the cause of abrupt changes in width of a PWM pulse.

DESCRIPTION OF THE PREFERRED EMBODIMENT

Figure 2:
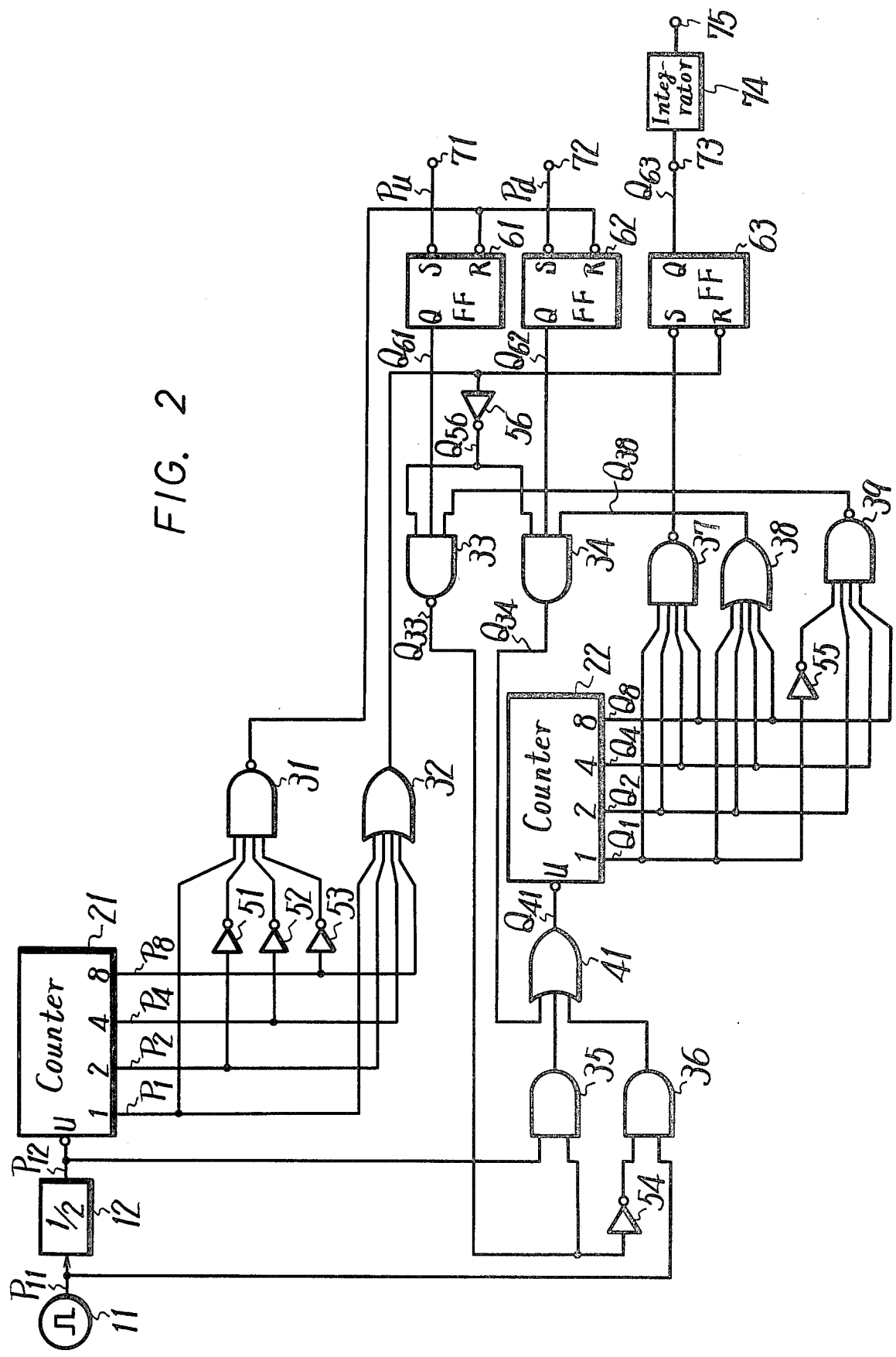
FIG. 2 is a block diagram showing a pulse width modulating circuit according to an embodiment of the present invention.

A pulse width modulating circuit according to an embodiment of the present invention is described with reference to FIG. 2.

In the embodiment in FIG. 2, a clock pulse oscillating circuit 11 produces a clock pulse $P_{11}$ having a constant frequency as shown in FIG. 3A. The clock pulse $P_{11}$ is fed to a frequency divider 12 which frequency divides clock pulse $P_{11}$ by a factor of 2 to produce a second clock pulse $P_{12}$ shown in FIG. 3B having half the frequency of $P_{11}$. Pulse $P_{12}$ is fed to the count input U of a counter 21. Counter 21 controls the time of the trailing edge of a PWM pulse and is, for example, a 4-bit binary up-counter of the negative-going trigger type. Binary outputs $P_1$, $P_2$, $P_4$ and $P_8$ (refer to FIGS. 3C to 3F) appearing at output terminals "1," "2," "4" and "8" of counter 21 are applied to an OR gate 32 whose OR-output is applied to a reset terminal R of an RS flip-flop circuit 63 of the negative-going trigger type.

A second 4-bit binary counter 22 is provided which is similar to first counter 21. Second counter 22 establishes the time of the leading edge of the PWM pulse. To this end, binary outputs $Q_1$, $Q_2$, $Q_4$ and $Q_8$ (refer to FIGS. 3O to 3R) appearing at output terminals "1," "2," "4" and "8" of counter 22 are fed to a NAND gate 37 whose NAND-output is applied to a set terminal S of a flip-flop circuit 63.

RS flip-flop circuits 61 and 62 are provided, each which is of the negative-going trigger type, for temporarily holding a modulating input pulse for increasing or decreasing the output of PWM pulse width. At a predetermined time, the modulating input pulse is executed. Flip-flop circuit 61 temporarily holds a modulating input for increasing the PWM pulse width. Flip-flop circuit 61 is supplied through an input terminal 71 with an INCREASE modulating pulse $P_u$ at its set terminal S shown in FIG. 3G for increasing the pulse width of the PWM pulse. The INCREASE modulating pulse $P_u$ is similar to the modulating pulse $P_b$ of the prior art shown in FIG. 1B. Flip-flop circuit 62 temporarily holds a modulating input for decreasing the pulse width. Flip-flop circuit 62 is supplied through an input terminal 72 with a DECREASE modulating pulse $P_d$ at its set terminal S shown in FIG. 3H to decrease the pulse width of the PWM pulse.

The output $P_1$ of counter 21 is fed directly to a NAND gate 31 which is also supplied with inverted outputs $P_2$, $P_4$ and $P_8$ from counter 21 inverted in inverters 51, 52 and 53, respectively. The NAND-output of NAND gate 31 is applied to reset terminals R of flip-flop circuits 61 and 62, respectively. The output of NAND gate 31 becomes "0" when the content of counter 21 becomes "1." At that time, flip-flop circuit 61 or 62 which may have been set by one of pulses $P_u$ and $P_d$ during the preceding time is reset when the content of counter 21 becomes "1."

When an INCREASE modulating pulse $P_u$ is received at flip-flop circuit 61, a set output $Q_{61}$ (refer to FIG. 3 I) of flip-flop circuit 61 is fed to a NAND gate 33 which is also supplied with the inverted output of OR gate 32 inverted in an inverter 56 and an output of a NAND gate 39. A set output $Q_{33}$ (refer to FIG. 3L) of NAND GATE 33 is fed to an AND gate 35 and also inverted in an inverter 54 and fed to an AND gate 36. The pulses $P_{12}$ from frequency divider 12 are fed to AND gate 35 and clock pulses $P_{11}$ from oscillator 11 are fed to AND gate 36, respectively. Normally, the output $Q_{33}$ from NAND gate 33 is "1." AND gate 35 then passes therethrough the pulses $P_{12}$. When the output $Q_{33}$ is "0" AND gate 36 passes therethrough the higher frequency pulse $P_{11}$. The pulse $P_{12}$ or $P_{11}$ from AND gate 35 or 36 are applied through an OR gate 41 to counter 22 as its count input U. The counting of higher frequency pulse $P_{11}$ advances the phase of counter 22 relative to counter 21.

When a DECREASE modulating pulse $P_d$ is received at flip-flop circuit 62, a set output $Q_{62}$ (refer to FIG. 3J) from flip-flop circuit 62 is fed to an AND gate 34 which is also supplied with the output $Q_{56}$ (refer to FIG. 3K) of inverter 56 and the output of an OR gate 38. An output $Q_{34}$ (refer to FIG. 3M) from AND gate 34 is applied through OR gate 41 to the count input U of counter 22. The output $Q_{34}$ blocks one alternation of the pulse $P_{12}$ in OR gate 41 thus retarding the phase of counter 22 with respect to counter 21.

The output $Q_1$ from counter 22 is inverted in an inverter 55 and applied to NAND gate 39 which is also directly supplied with the outputs $Q_2$, $Q_4$ and $Q_8$ from counter 22. The NAND-output from NAND gate 39 is fed to NAND gate 33. The outputs $Q_1$ to $Q_8$ from counter 22 are fed to OR gate 38 whose OR-output $Q_{38}$ is fed to AND gate 34. The set output $Q_{63}$ of flip-flop circuits 63 is fed to an output terminal 73 which feeds an integrating circuit 74 to develop at its output terminal 75 a voltage corresponding to the DC voltage $E_d$ shown in FIG. 1D.

In the embodiment of the invention shown and described above, PWM operation as shown in the timing charts of FIGS. 3A to 3S and 4A to 4S is achieved.

To simplify the intitial description of operation which follows, it is assumed that the outputs from OR gate 38 and NAND gate 39 remain "1" regardless the content of counter 22. The constant frequency frequency divided pulse $P_{12}$ (shown in FIG. 3B) is fed to the count input U of the counter 21. Counter 21 counts input pulses at a constant speed corresponding to the frequency of the pulse $P_{12}$ and produces binary outputs $P_1$ to $P_8$ (refer to FIGS. 3C to 3F) having a constant period. Each time the content of counter 21 becomes "1," NAND gate 31 develops an output. This output, applied to the reset inputs R of flip-flop circuits 61 and 62, resets these flip-flop circuits once per cycle of counter 21. When no modulating pulses $P_u$ and $P_d$ (shown in FIGS. 3G and 3H) have been received at flip-flop circuits 61 and 62 before a time $t_1$ (refer to FIGS. 3A–3S), the outputs $Q_{61}$ and $Q_{62}$ (shown in FIGS. 3I and 3J) from flip-flop circuits 61 and 62 both remain "0" throughout the cycle of counter 21. Each time the content of counter 21 reaches "0," the output $Q_{56}$ (refer to FIG. 3K) from inverter 56 becomes "1."

When no INCREASE modulating pulse $P_u$ has been received, the output $Q_{61}$ from flip-flop circuit 61 is "0" ($Q_{61}$="0"). The output $Q_{33}$ (refer to FIG. 3L) from NAND gate 33 remains "1" regardless the condition of the other inputs to NAND gate 33. The resulting "1" at the input to NAND gate 35 enables the passage therethrough of pulse $P_{12}$ from frequency divider 12 which is fed through OR gate 41 to the count input U of counter 22. Assuming that no DECREASE modulating pulse $P_d$ has been received at flip-flop circuit 62, the output $Q_{62}$ from flip-flop circuit 62 is "0" ($Q_{62}$="0"). Thus the output $Q_{34}$ (refer to FIG. 3M) from AND gate 34 remains "0". Therefore, the output $Q_{34}$ fed to an input of OR gate 41 remains "0" regardless the condition of the other inputs to AND gate 34. An output $Q_{41}$ (refer to FIG. 3N) from OR gate 41 coincides with the pulse $P_{12}$ which is fed therethrough from AND gate 35 to the count input U of counter 22.

Therefore, while $Q_{33}$ remains "1" and $Q_{34}$ remains "0," counter 22 is clocked at a constant speed equal to the frequency of pulse $P_{12}$. This is the same speed at which counter 21 is clocked. Thus, counter 22 produces binary outputs $Q_1$ to $Q_8$ (refer to FIGS. 3O to 3R) which have the same period as the binary outputs $P_1$ to $P_8$ from counter 21. In the continued absence of modulating pulses $P_D$ and $P_U$, counters 21 and 22 continuously cycle at the same rate but their outputs may be shifted in phase, that is, counter 21 may reach "0" at a different time from counter 22.

Upon initial turn on of the apparatus, counters 21 and 22 may be initially preset to predetermined values by means (not shown) well known in the art. This establishes an initial known relationship between the phases of counters 21 and 22 which may later be controlled by application of modulating pulses $P_U$ and $P_D$.

When the content of counter 22 becomes "15," NAND gate 37 produces an output which is fed to the set input S of flip-flop circuit 63 to set flip-flop circuit 63. This establishes the leading edge of the PWM output $Q_{63}$. When the content of counter 21 becomes "0," OR gate 32 produces an output which is fed to the reset input R of flip-flop circuit 63 to reset it. This establishes the trailing edge of the PWM output. Thus, the output $Q_{63}$ from flip-flop circuit 63 becomes "1" when the content of counter 22 reaches "15" and is returned to "0" when the content of counter 21 reaches "0" as shown in FIG. 3S. The output $Q_{63}$ is delivered to output terminal 73.

When no modulating pulses $P_u$ and $P_d$ are fed to flip-flop circuits 61 and 62, for example as shown in FIGS. 3A–3S and 4A–4S before time $t_1$, a constant phase difference exists between the counts of counter 21 and 22. Therefore, the pulse width of the output $Q_{63}$ from flip-flop circuit 63 is a contant CWA: value $\tau$, i.e. the output $Q_{63}$ is a PWM pulse having a predetermined pulse width $\tau$.

When an INCREASE modulating pulse $P_u$ is applied to the set terminal S of flip-flop circuit 61 at a desired time, for example at time $t_1$ in FIG. 3A–3S, flip-flop circuit 61 is set and its set output $Q_{61}$ becomes "1." When the content of counter 21 reaches "0" at time $t_2$ after time $t_1$, the output $Q_{56}$ from inverter 56 becomes "1." Therefore, the output $Q_{33}$ from NAND gate 33 becomes "0" during one cycle of the pulse $P_{12}$ after time $t_2$ (within which the content of counter 21 is "0"). The "0" on $Q_{33}$ is inverted in inverter 54 and the resulting "1" is applied to one input of AND gate 36. Two cycles of pulse $P_{11}$ are gated through AND gate 36 and OR gate 41 to the count input U of counter 22 during the "0" in counter 21. Accordingly, during this period, two cycles of Pulse $P_{11}$ are fed to counter 22 in place of the single pulse $P_{12}$ normally fed to it during this time. The count of counter 22 therefore advances one count with respect to the count of counter 21.

As a result of advancing the count of counter 22, the time at which the content of counter 22 reaches a count of "15" after the time $t_2$ is moved forward in time so that the content of counter 22 reaches a count of "15" earlier in the cycle. Therefore, the time at which flip-flop circuit 63 is set occurs earlier without affecting the time at which it is reset. Thus the pulse width of the PWM output $Q_{63}$ increases. That is, when the INCREASE modulating pulse $P_u$ is applied to flip-flop circuit 61, the pulse width of the PWM output $Q_{63}$ is increased from the previous value $\tau$ by a predetermined amount $\Delta\tau$ ($\Delta\tau$ equals one cycle of pulse $P_{12}$) and modulation of the PWM is achieved.

When the content of counter 21 becomes "1" at time $t_3$ after time $t_2$, flip-flop circuit 61 is reset by the output from NAND gate 31 and accordingly its output $Q_{61}$ becomes "0." Thereafter, if no further modulating pulses $P_u$ or $P_d$ are applied to flip-flop circuits 61 and 62, the pulse width of the PWM output $Q_{63}$ remains $\tau + \Delta\tau$.

Thereafter, if an additional INCREASE modulating pulse $P_u$ is applied to flip-flop circuit 61, operation described above is repeated. Each time an INCREASE modulating pulse $P_u$ is applied, the pulse width of the PWM output $Q_{63}$ is increased by an amount $\Delta\tau$.

When a DECREASE modulating pulse $P_d$ (refer to FIG. 4H) is applied to the set input S of flip-flop circuit 62 at time $t_1$ in FIGS. 4A–4S before time $t_1$, the state is assumed to be the same as that before time $t_1$ in FIGS. 3A–3S, flip-flop circuit 62 is set and its output $Q_{62}$ becomes "1" as shown in FIG. 4J which state is continued to time $t_3$. When the output $Q_{56}$ from inverter 56 becomes "1" as counter 21 reaches "0" at time $t_2$ as shown in FIG. 4K, the output $Q_{34}$ from AND gate 34 becomes "1," as shown in FIG. 4M. The presence of $Q_{34}$ at one input of OR gate 41 maintains a "1" at the count input U of counter 22 for one full cycle of pulse $P_{12}$ rather than permitting the normal cycling of output $Q_{41}$ during this time. Thus, one cycle of pulse $P_{12}$ is missing in the output $Q_{41}$ from OR gate 41 as shown in FIG. 4N. Accordingly, the count of counter 22 is delayed by "1" compared to the count of counter 21. Thus, the time when flip-flop circuit 63 is set becomes delayed without affecting the time it becomes reset and hence the pulse width of the PWM output $Q_{63}$ decreases. That is, when the DECREASE modulating pulse $P_d$ is applied to flip-flop circuit 62, the pulse width of the PWM output $Q_{63}$ from flip-flop circuit 63 is decreased from the previous value $\tau$ by a predetermined value of $\Delta\tau$.

After time $t_3$, the pulse width of the PWM output $Q_{63}$ remains constant at $\tau - \Delta\tau$ provided that no additional modulating pulse $P_u$ or $P_d$ is applied to flip-flop circuits 61 or 62. Each time an additional DECREASE modulating pulse $P_d$ is applied, the pulse width of the output $Q_{63}$ is decreased by an additional value of $\Delta\tau$.

As described above, the pulse width of the PWM output $Q_{63}$ is increased or decreased by $\Delta\tau$ following each arrival of a modulating pulse $P_u$ or $P_d$ and hence the width of the PWM pulse is controlled by the modulating pulse $P_u$ or $P_d$.

A problem may arise when one or the other modulating pulse $P_d$ or $P_u$ is applied continuously. For example, if only DECREASE modulating pulse $P_d$ is continuously applied, the content $Q_{21}$ (refer to FIG. 5B) of counter 21 continues to cycle at a constant speed and phase in response to pulse $P_{12}$ (refer to FIG. 5A) but the phase of counter 22 is respectively retarded by $\Delta\tau$ at each cycle. As shown in FIGS. 5A–5F, before time $t_{11}$ the content $Q_{22}$ (refer to FIG. 5D) of counter 22 cycles at the same speed as content $Q_{21}$ of counter 21 with a constant phase difference between them. Counter 22 may, for example, lead in phase by two cycles of $P_{12}$ (compare FIGS. 5B and 5D). The PWM output $Q_{63}$, shown in FIG. 5E, becomes "1" when the content $Q_{22}$ becomes "15" and "0" when the content $Q_{21}$ becomes "0," so that the pulse width of the output $Q_{63}$ is the width of two cycles of pulse $P_{12}$ in the figure.

When a DECREASE modulating pulse $P_d$ is applied at, for example, time $t_{11}$ in FIG. 5C the phase of $Q_{22}$ is delayed one cycle of $P_{12}$. As a result, the pulse width of the output $Q_{63}$ is reduced from two cycles to one cycle of pulse $P_{12}$. If nothing is provided to prevent it, when another DECREASE modulating pulse $P_d$ is applied at a time $t_{12}$ after the time $t_{11}$, the phase of the content $Q_{22}$ is further delayed one cycle of $P_{12}$. Hence, the time when the content $Q_{22}$ reaches "15" coincides with the time when the content $Q_{21}$ reaches "0." Accordingly, flip-flop circuit 63 receives set and reset signals at the same time. Thus, if the reset input is dominant in flip-flop circuit 63, the pulse width of its output $Q_{63}$ becomes "0."

With a reset-dominant flip-flop circuit 63, when an additional DECREASE modulating pulse $P_d$ is applied at time $t_{13}$, the content $Q_{22}$ is further delayed in phase one additional cycle of $P_{12}$. Now, however, when the content $Q_{22}$ is "15" the output $Q_{63}$ becomes "1" and when the content $Q_{21}$ is "0" the output $Q_{63}$ becomes "0," respectively. Thus, the pulse width of the output $Q_{63}$ suddenly goes from zero to maximum as shown in solid line in FIG. 5E. Thus, when modulating pulse $P_d$ is repetitively applied the pulse width of the output PWM pulse $Q_{63}$ gradually decreases to zero and then abruptly jumps to maximum.

Instead of the reset being dominant in flip-flop circuit 63, if the set input is dominant, the pulse width of its output $Q_{63}$ abruptly becomes maximum following the DECREASE modulating pulse $P_d$ applied at the time $t_{12}$ as shown in dotted line in FIG. 5E.

Therefore, when the PWM output $Q_{63}$ is used to achieve remote control of sound volume in a television receiver as described in connection with FIG. 1, if remote control is continued in one direction the sound volume gradually decreases, passes through zero (minimum) then instantly jumps to maximum.

Similarly, when only INCREASE modulating pulses $P_u$ are repetitively applied, the pulse width of the PWM output $Q_{63}$ gradually increases, passes through maximum and then abruptly drops to zero. Therefore, in remotely controlling an increase in sound volume by means of a PWM pulse $Q_{63}$, the sound volume gradually increases through a maximum then instantly drops to zero (or minimum).

Such abrupt changes in sound volume are an undesirable annoyance.

To avoid this problem, the present invention shown in FIG. 2, provides OR gate 38 and NAND gate 39 as described above which prevent abrupt changes from maximum to minimum width and vice versa of the PWM output $Q_{63}$. That is, as may be apparent from FIGS. 4A-4S the output $Q_{34}$ (FIG. 4A) from AND gate 34 retards the phase of content $Q_{22}$ of the counter 22 in response to the modulating pulse $P_d$, and becomes "1" when the content $Q_{21}$ of counter 21 reaches "0." Accordingly, when the content $Q_{22}$ of counter 22 is retarded enough to equal the content $Q_{21}$ of counter 21, when the content $Q_{22}$ reaches zero ($Q_{22}=0$), the output $Q_{34}$ from AND gate 34 is "0" ($Q_{34}=0$) by the "0" applied thereto by output $Q_{38}$ of OR gate 38. Thus the "1" otherwise available on $Q_{34}$ at this time is suppressed and further delay in the phase of counter 22 is prevented. Therefore, when counters 21 and 22 cycle with equal phase, further retarding of the phase of counter 22 is prevented.

When the second DECREASE modulating pulse $P_d$ is applied at, for example, time $t_{12}$ (refer to FIGS. 5A-5F), the phase of the content $Q_{22}$ of counter 22 is delayed into coincidence with $Q_{21}$. Further, when the content $Q_{22}$ reaches zero ($Q_{22}=0$), the output $Q_{38}$ of OR gate 38 becomes "0" (refer to FIG. 5F). At this time, since the content $Q_{21}$ is also zero ($Q_{21}=0$), the output of NAND gate 39 is "1." Further, since the DECREASE modulating pulse $P_d$ is applied, the output $Q_{62}$ of flip-flop circuit 62 is "1." However the "0" on $Q_{38}$ at this time keeps the output $Q_{34}$ of AND gate 34 "0." Accordingly, the "1" on output 34 to further retard the phase of the content $Q_{22}$ of counter 22 is not generated and counters 21 and 22 cycle in synchronism thus producing minimum PWM output $Q_{63}$ (if output $Q_{34}$ is "0" between times $t_2$ and $t_3$ in FIG. 4N, the output $Q_{41}$ from OR gate 41 is controlled by the pulse $P_{12}$ and hence the phase of the content $Q_{22}$ is not delayed). As a result, even if the DECREASE modulating pulse $P_d$ is applied successively after time $t_{11}$, the phase of the content $Q_{22}$ of counter 22 is not further delayed. Therefore, when the pulse width of the PWM output $Q_{63}$ reaches a minimum value of one cycle of pulse $P_{12}$, this minimum value is maintained.

Except when the PWM output $Q_{63}$ is minimum the output $Q_{38}$ from OR gate 38 has no effect since, when the contents $Q_{21}$ and $Q_{22}$ are not equal ($Q_{21} \neq Q_{22}$) the "0" on output $Q_{38}$ does not coincide with the "1" on output $Q_{56}$. Therefore, if a DECREASE modulating pulse $P_d$ is applied, the pulse width of the PWM output $Q_{63}$ is reduced.

When an INCREASE modulating pulse $P_u$ is applied successively to flip-flop circuit 61, when the content of counter 22 becomes "14" at the same time that the output $Q_{22}$ becomes "0," the output of NAND gate 39 becomes "0" at the same time that the output $Q_{56}$ of inverter 56 becomes "1." The "0" from NAND gate 39 prevents change of state of the output $Q_{33}$ of NAND gate 33. Thus the "1" state of the output $Q_{33}$ is continued. Therefore, even if the INCREASE modulating pulse $P_u$ is applied successively, the pulse width of the PWM output $Q_{63}$ increases only to a maximum value and then remains at that maximum value.

As described above, according to the present invention, the width of the PWM output pulse $Q_{63}$ is varied in response to the modulating pulses $P_u$ and $P_d$ between minimum and maximum limits without abrupt changes in width in response to continued application of modulating pulses. As will be clear from FIG. 2, this invention avoids the use of up-and-down counters so that the pulse width modulating circuit of the present invention can be inexpensively manufactured.

Further, even if modulating pulse $P_u$ or $P_d$ is applied successively, the pulse width of the PWM output $Q_{63}$ does not change abruptly and hence the corresponding abrupt changes in remotely controlled sound volume are avoided.

The above description is given of a single embodiment of the invention with reference to the accompanying drawings, but it is understood that many modifications and variations could be affected by one skilled in the art without departing from the spirits or scope of the novel concepts of the present invention. Therefore, the spirits or scope of the invention should be determined by the appended claims.

We claim as our invention:

1. A pulse width modulating circuit comprising:
   pulse generating means for generating clock pulses having a predetermined period;
   first counter means having an output phase for counting said clock pulses from said pulse generating means;
   second counter means having an output phase for counting said clock pulses from said pulse generating means;
   pulse number control means for controlling the number of said clock pulses supplied to said second counter means including pulse adding means for adding at least one additional pulse to the clock pulses fed from said pulse generating means to said second counter means in response to a first control signal and pulse subtracting means for subtracting at least one pulse from the clock pulses fed from said pulse generating means to said second counter means in response to a second control signal; and
   phase detecting means for producing a pulse width modulated signal in response to a phase difference between said output phase of said first counter means and said output phase of said second counter means.

2. A pulse width modulating circuit according to claim 1, wherein said phase detecting means includes first logic circuit means for detecting a condition of said first counter means, second logic circuit means for detecting a condition of said second counter means, and bistable circuit means triggered by outputs of said first and second logic circuit means.

3. A pulse width modulating circuit according to claim 2, wherein said bistable circuit means is a flip-flop circuit which is set by the output of said second logic circuit means and is reset by the output of said first logic circuit means.

4. A pulse width modulating circuit comprising:
   pulse generating means for generating clock pulses having a predetermined period;
   first counter means having an output phase for counting said clock pulses from said pulse generating means;
   second counter means having an output phase for counting said clock pulses from said pulse generating means;

pulse number control means for controlling the number of said clock pulses supplied to said second counter means in response to a control signal;

said pulse number control means including pulse adding means for adding at least one additional pulse to the clock pulses fed from said pulse generating means to said second counter means in response to a first control signal, and pulse subtracting means for subtracting at least one pulse from the clock pulses fed from said pulse generating means to said second counter means in response to a second control signal; and phase detecting means for producing a pulse width modulated signal in response to a phase difference between said output phase of said first counter means and said output phase of said second counter means;

wherein said pulse generating means includes clock pulse means having a first output, a dividing circuit operative to produce a second output having a frequency lower than said first output, said second output being supplied to said first and second counter means and said first output being selectively supplied to said pulse adding means as said at least one additional pulse.

5. A pulse width modulating circuit according to claim 4, wherein said pulse adding means includes switching circuit means for alternatively supplying one of said first and second outputs to said second counter means in response to said first control signal and wherein said pulse subtracting means includes gate circuit means for inhibiting a clock pulse from said dividing circuit to said second counter means in response to said second control signal.

6. A pulse width modulating circuit according to claim 1, further comprising means for preventing said adding in response to a first condition and for preventing said subtracting in response to a second condition.

7. A pulse width modulating circuit according to claim 6, wherein said first condition is a first predetermined phase difference between said output phases of said first and second counter means and said second condition is a second predetermined phase difference between said output phases of said first and second counter means.

8. A pulse width modulating circuit according to claim 7, wherein said first predetermined phase difference produces a maximum width pulse width modulated signal and said second predetermined phase difference produces a minimum width pulse width modulated signal.

9. A pulse width modulating circuit comprising: clock pulse generating means for generating a first clock pulse having a first frequency; second clock pulse generating means for generating a second clock pulse having a second frequency equal to half said first frequency; first counter means having a counting capacity and a first output phase for counting said second clock pulse; second counter means having a counting capacity equal to the counting capacity of said first counter means and a second output phase for counting said second clock pulse; bistable means set by a first predetermined counting condition of said second counter means and reset by a second predetermined condition of said first counter means, said bistable means having an output constituting a pulse width modulated signal; first control means responsive to a first control signal for replacing at least one cycle of said second clock pulse at said second counter means with at least two cycles of said first clock pulse whereby the width of said pulse width modulated signal is increased; second control means responsive to a second control signal for rendering ineffective at least one cycle of said second clock pulse at said second counter means whereby the width of said pulse width modulated signal is decreased; first gating means for rendering said first control means ineffective in response to a maximum width of said pulse width modulated signal; and second gating means for rendering said second control means ineffective in response to a minimum width of said pulse width modulated signal.

* * * * *